(12) United States Patent
Zhang et al.

(10) Patent No.: US 10,411,051 B2
(45) Date of Patent: Sep. 10, 2019

(54) COPLANAR ELECTRODE PHOTODIODE ARRAY AND MANUFACTURING METHOD THEREOF

(71) Applicant: Nuctech Company Limited, Haidian District, Beijing (CN)

(72) Inventors: Lan Zhang, Beijing (CN); Yuanjing Li, Beijing (CN); Yinong Liu, Beijing (CN); Haifan Hu, Beijing (CN); Jun Li, Beijing (CN)

(73) Assignee: Nuctech Company Limited, Haidian District, Beijing (CN)

( * ) Notice: Subject to any disclaimer, the term of this patent is extended or adjusted under 35 U.S.C. 154(b) by 63 days.

(21) Appl. No.: 15/580,848

(22) PCT Filed: Aug. 31, 2016

(86) PCT No.: PCT/CN2016/097517
§ 371 (c)(1),
(2) Date: Dec. 8, 2017

(87) PCT Pub. No.: WO2017/113846
PCT Pub. Date: Jul. 6, 2017

(65) Prior Publication Data
US 2018/0342542 A1      Nov. 29, 2018

(30) Foreign Application Priority Data

Dec. 29, 2015   (CN) .......................... 2015 1 1010038

(51) Int. Cl.
*H01L 27/144*    (2006.01)
*H01L 27/146*    (2006.01)
(Continued)

(52) U.S. Cl.
CPC ........ *H01L 27/1446* (2013.01); *H01L 27/146* (2013.01); *H01L 27/1443* (2013.01);
(Continued)

(58) Field of Classification Search
CPC ............. H01L 27/1446; H01L 31/0224; H01L 27/1443; H01L 31/035281; H01L 31/1804; H01L 27/146
See application file for complete search history.

(56) References Cited

U.S. PATENT DOCUMENTS 6,380,602 B1   4/2002  Fujisawa et al.
8,530,264 B2   9/2013  De Munck et al.
(Continued)

FOREIGN PATENT DOCUMENTS

| CN | 1447445 A | 10/2003 |
| CN | 103594468 A | 2/2014 |

(Continued)

OTHER PUBLICATIONS

International Search Report and Written Opinion of the International Searching Authority for corresponding International Patent Application No. PCT/CN2016/097517 dated Dec. 6, 2016, 8 pages.
(Continued)

*Primary Examiner* — Mohammed R Alam
(74) *Attorney, Agent, or Firm* — Merchant & Gould P.C.

(57) ABSTRACT

A coplanar electrode photodiode array and a manufacturing method thereof are disclosed. On a top side of a low resistance rate substrate, a high resistance epitaxial silicon wafer, a first conductive type heavily doped region and a second conductive type doped region are formed, which are a cathode and an anode of a photodiode respectively. The structure includes a trench structure formed between the anode and the cathode, the trench structure may be form by a gap, an insulating material, a conductive structure, a reflective material, and ion implantation, and also includes a first conductive type heavily doped region, an insulating isolation layer or a conductive structure with an insulating layer, and the like formed under the anode and the cathode.

12 Claims, 7 Drawing Sheets

(51) Int. Cl.
H01L 31/0224 (2006.01)
H01L 31/0352 (2006.01)
H01L 31/18 (2006.01)

(52) U.S. Cl.
CPC .. *H01L 31/0224* (2013.01); *H01L 31/035281* (2013.01); *H01L 31/1804* (2013.01)

(56) References Cited

U.S. PATENT DOCUMENTS

| | | | |
|---|---|---|---|
| 2005/0184353 | A1 | 8/2005 | Mouli |
| 2010/0301442 | A1* | 12/2010 | Iwai ............... H01L 31/022416 257/437 |
| 2012/0028401 | A1 | 2/2012 | De Munck et al. |
| 2012/0261729 | A1* | 10/2012 | Finkelstein ........... H01L 31/107 257/290 |
| 2014/0291481 | A1 | 10/2014 | Zhang et al. |

FOREIGN PATENT DOCUMENTS

| | | |
|---|---|---|
| CN | 105185796 A | 12/2015 |
| CN | 105448945 A | 3/2016 |
| CN | 205319156 U | 6/2016 |
| JP | S53-010987 A | 1/1978 |
| JP | S61-084061 A | 4/1986 |
| JP | 2000-312021 A | 11/2000 |
| JP | 2002-353431 A | 12/2002 |
| JP | 2005-045125 A | 2/2005 |
| JP | 2008-066446 A | 3/2008 |
| JP | 2012-033928 A | 2/2012 |

OTHER PUBLICATIONS

Chinese Office Action for corresponding Chinese Patent Application No. 201511010038.8 dated Dec. 1, 2017, 6 pages.
Extended European Search Report for corresponding European Patent Application No. 16880639.6 dated Jul. 5, 2019, 6 pages.

* cited by examiner

COPLANAR ELECTRODE PHOTODIODE ARRAY AND MANUFACTURING METHOD THEREOF

This application is a National Stage Application of PCT/CN2016/097517, filed 31 Aug. 2016, which claims benefit of Serial No. 201511010038.8, filed 29 Dec. 2015 in China and which applications are incorporated herein by reference. A claim of priority is made to each of the above disclosed applications.

TECHNICAL FIELD

Embodiments of the present disclosure relate to a photodiode, and in particular, to a coplanar electrode photodiode array structure and a manufacturing method thereof.

BACKGROUND

A semiconductor photodiode array generates non-equilibrium carriers to detect incident light by generating visible light in the scintillator through direct incident light or X-ray, which may cause ionization reaction with atoms in the semiconductor. Key parameters for measuring the performance of a photodiode array include resolution, signal-to-noise ratio, readout speed, and inter-pixel charge crosstalk etc. In addition, the charge collection uniformity of active regions for collecting dark current and light inside single pixel is also of particular importance.

SUMMARY

In view of one or more problems in the prior art, a coplanar electrode photodiode array and a manufacturing method thereof are proposed.

According to an aspect of the present disclosure, a coplanar electrode photodiode array comprising a plurality of coplanar photodiodes is provided, each coplanar photodiode comprising:

a first conductive type heavily doped semiconductor substrate;

a first conductive type lightly doped semiconductor layer formed on the first conductive type heavily doped semiconductor substrate;

a second conductive type heavily doped semiconductor region formed on an upper portion of the first conductive type lightly doped semiconductor layer, wherein the second conductive type heavily doped semiconductor region and the first conductive type lightly doped semiconductor layer form a PN junction diode, and a second electrode is extracted out of the second conductive type heavily-doped semiconductor layer at a light incidence side;

a first conductive type heavily doped semiconductor region surrounding the second conductive type heavily doped semiconductor region, wherein a first electrode is extracted out of the first conductive type heavily doped semiconductor region at the light incidence side; and a trench structure disposed between the second conductive type heavily doped semiconductor region and the first conductive type heavily doped semiconductor region.

According to some embodiments, the trench structure is formed by filling a trench with an insulating material or a plurality of composite insulating materials, or a light reflective material.

According to some embodiments, the trench structure is formed by filling a trench with a first conductivity type heavily doped monocrystalline semiconductor or polycrystalline semiconductor material.

According to some embodiments, the trench structure includes and forms a first conductivity type heavily doped region around the trench.

According to some embodiments, the trench structure includes an unfilled trench, and an insulating layer, a multilayer composite insulating layer, or a light reflecting material is covered on a bottom and a sidewall of the trench.

According to some embodiments, a first conductivity type heavily doped region is formed around the trench, and an insulating layer, a multilayer composite insulating layer or a light reflecting material is covered on the bottom and the sidewall of the trench.

According to some embodiments, the trench structure includes a trench, an insulating material or a plurality of composite insulating materials or light reflecting materials is covered on a bottom and a sidewall of the trench, and then the trench is filled with monocrystalline semiconductor material or polycrystalline semiconductor material.

According to some embodiments, monocrystalline semiconductor material or polycrystalline semiconductor material filled in the trench is connected to a high potential relative to the second electrode at.

According to some embodiments, a thin first conductive type heavily doped region or a second conductive type lightly doped region is formed in the upper portion of the second conductive type heavily doped semiconductor region and surrounded by the second conductive type heavily doped region.

According to some embodiments, a continuous first conductive type heavily doped region is formed in a lower portion of the second conductive type heavily doped region or only a section of the first conductive type heavily doped region is disposed under the second conductive type heavily doped region.

According to some embodiments, a continuous insulating material region is formed under the second conductive type heavily doped region, or only a section of the insulating material region is disposed under the second conductive type heavily doped region.

According to some embodiments, the first conductive type heavily doped region is formed as a trench structure, which extends down to and is connected to the first conductive type heavily doped region or insulating material region.

According to some embodiments, a continuous conductive structure with an insulating layer is formed under the second conductivity type heavily doped region or only a section of the conductive structure with the insulating layer is disposed under the second conductive type heavily doped region, and the conductive structure is made of insulating material or semiconductor material.

According to some embodiments, the first conductive type heavily doped region is a trench structure, which extends down to and is connected to the semiconductor material region in the conductive structure with the insulating layer.

According to an aspect of the present disclosure, a method for manufacturing a coplanar electrode photodiode is provided, which comprises:

forming a first conductivity type lightly doped semiconductor layer on a first conductive type heavily doped semiconductor substrate;

forming a second conductive type heavily doped semiconductor region on an upper portion of the first conductive type lightly doped semiconductor layer, wherein the second conductive type heavily doped semiconductor region and the first conductive type lightly doped semiconductor layer form a PN junction diode, and a second electrode is extracted out of the second conductive type heavily doped semiconductor layer at a light incidence side;

forming a first conductive type heavily doped semiconductor region around the second conductive type heavily doped semiconductor region, wherein a first electrode is extracted out of the first conductive type heavily doped semiconductor region at the light incidence side; and disposing a trench structure between the second conductive type heavily doped semiconductor region and the first conductive type heavily doped semiconductor region.

With the solution of the above embodiments, it is possible to effectively block the spreading of hole carriers to non-active regions when detecting X-rays and improve the light response and collection efficiency at the edge of the active region.

BRIEF DESCRIPTION OF THE DRAWINGS

The above and other objects, features and advantages of the present disclosure will be more apparent from the following detailed description taken in conjunction with the accompanying drawings, in which.

REFERENCE NUMERALS DESCRIPTION

Figure 1A:
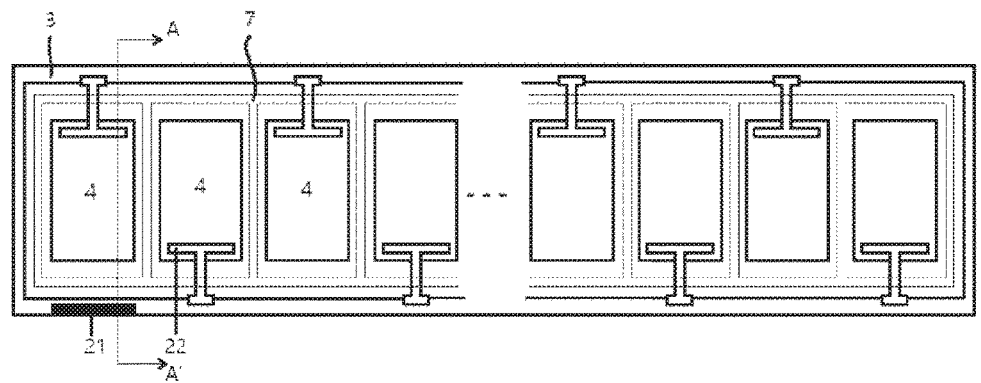
FIG. 1A is a top view illustrating a photodiode according to an embodiment of the present disclosure.

1. N+ type semiconductor layer; 2. N− type semiconductor layer; 3. N+ type semiconductor region; 4. P+ type semiconductor region; 5. Single-layer insulating layer, multi-layer composite insulating layer or light reflecting material; 6. Space charge region; 7. Single-layer insulating layer, multi-layer composite insulating layer or a light reflecting material, or a P+ type semiconductor material; 8. Gap region; 10. N+ or P+ doped monocrystalline semiconductor material or polycrystalline semiconductor material; 11. Thinner N+ type semiconductor region or P− type semiconductor region; 12. N+ type semiconductor region or insulating material region such as silicon dioxide or silicon nitride; 13. N− type semiconductor layer; 14, Insulating material such as silicon dioxide, silicon nitride; 15. Heavily doped semiconductor material such as monocrystalline silicon, polycrystalline silicon or germanium; 16. Insulating material such as silicon dioxide, silicon nitride; 21. Extraction electrode of N+ type semiconductor region; 22 Extraction electrode of P+ type semiconductor region; 31. N+ type semiconductor region; 32. N+ type semiconductor region; and 34. Single-layer insulating layer, multi-layer composite insulating layer or a light reflecting material.

DETAILED DESCRIPTION

Hereinafter, an exemplary embodiment of the present disclosure will be described with reference to the accompanying drawings. The descriptions of well-known functions or constructions will be omitted, in order to avoid make the subject matter of the present disclosure unclear. Also, the actual parts in the drawings are simplified or exaggerated for clarity of illustration. Here, the position of the characteristic layer or region may indicate a relative position, but the actual situation is not necessarily the same proportion as that in the schematic diagram. The structure characteristics of the photodiode according to the embodiment will be described with reference to FIGS. 1 to 13.

In a photodiode array according to the embodiment of the present disclosure, a light detection channel corresponding to a pixel is formed in a first conductive type epitaxial silicon wafer. The epitaxial silicon wafer is a low-resistance substrate and a high-resistance epitaxial silicon wafer. Forming of the light detection channel comprises: implanting a first conductive type ion, to form a heavily doped region which has a region for collecting majority carriers generated by the incidence of the light to be detected on a surface of the epitaxial silicon wafer; and implanting a second conductive type ion, to form a heavily doped region which forms a PN junction with the first conductive type epitaxial silicon wafer on the surface of the epitaxial silicon wafer, and setting its corresponding implantation position in the manner of the light detecting channel, so that the heavily doped region minority has a region for collecting less carriers generated by the incidence of the light to be detected, the region is a light-collecting active region. The two conductive type heavily doped regions cannot be placed adjacent to each other to prevent tunneling effect, the high-resistance epitaxial material of a semiconductor substrate is between the two conductive type heavily doped regions. The PN junction of the photodiode array can operate in a reverse bias mode to form a wide space charge region under the reverse bias mode in the vicinity of the light-collecting active region in the pixel. The PN junction of the photodiode array can also operate in a zero bias mode, and a narrower built-in space charge region at zero bias is formed in the vicinity of the light-collecting active region in the pixel.

The light enters into a silicon semiconductor through an incident window and makes collision ionization with the silicon atom in the light-collecting active region to generate electron-hole pairs. The electrons will drift or spread to the first conductive type heavily doped region under a built-in electric field or an externally biased electric field and will finally be collected; and the holes will drift or spread to the second conductive type heavily doped region under the built-in electric field or the externally biased electric field and will finally be collected, thereby an electric signal being read. Taking into account the PN junction capacitance effect, the spacing between the first conductive type and the second conductive type doped regions may be large, and carriers excited at edge positions of active region of the pixel can be easily collected by the adjacent pixels in the photodiode array, and additionally be trapped by traps or defects in silicon body.

For example, the coplanar electrode photodiode array includes a plurality of coplanar photodiodes, each of the coplanar photodiodes includes: a first conductive type heavily doped semiconductor substrate; a first conductive type lightly doped semiconductor layer formed on the first conductive type heavily doped semiconductor substrate; a second conductive type heavily doped semiconductor region formed on an upper portion of the first conductive type lightly doped semiconductor layer, the second conductive type heavily doped semiconductor region and the first conductive type lightly doped semiconductor layer forming a PN junction diode and a second electrode being extracted out of the second conductive type heavily doped semiconductor layer at a light incident side; a first conductive type heavily doped semiconductor region around the second conductive type heavily doped semiconductor region, and the first electrode being extracted out of the first conductive type heavily doped semiconductor region at the light incident side; and a trench structure disposed between the second conductive type heavily doped semiconductor region and the first conductive type heavily doped semiconductor region.

Figure 1B:
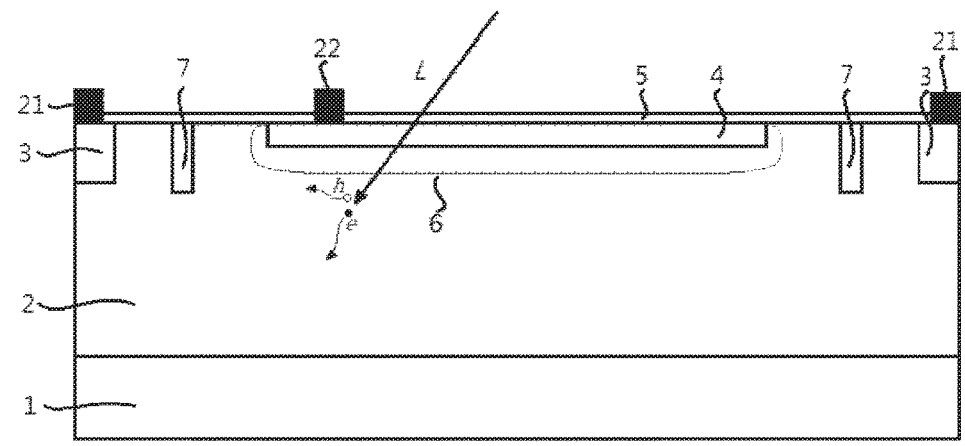
FIG. 1B is a schematic view for explaining a structure of the cross-section A-A' of the photodiode as descripted.

FIGS. 1A and 1B show a single cell structure of the photodiode array as descripted, wherein FIG. 1A shows a top view of a single cell structure; and FIG. 1B shows a cross-sectional view taken along line AA' of FIG. 1A. The photodiode structure is made on an N type epitaxial wafer comprising an N+ type semiconductor substrate region 1 and an N− type epitaxial semiconductor substrate region 2. The thickness range of the N+ type semiconductor substrate region is about 300 to 575 µm, the resistivity of it is 0.002 to 0.005 Ω·cm, the thickness range of the N− type epitaxial semiconductor region is about 20 to 100 µm, and the resistivity of is about 1 kΩ·cm. In the scheme of the present disclosure, "high impurity concentration (heavily doped)" indicates, for example, that the impurity concentration is about $1\times10^{17}$ cm$^{-3}$ or more and "+" is added to the conductive type. "Low impurity concentration (lightly doped)" indicates, for example, that the impurity concentration is about $1\times10^{17}$ cm$^{-3}$ or less, for example, and "−" is added to the conductive type. As the N type impurity, phosphorus (P), or arsenic (As) or the like is present, and as the P type impurity, boron (B) or the like is present.

On an upper side of the N− Type epitaxial semiconductor region 2, an N+ type semiconductor region 3 and a P+ type semiconductor region 4 are formed. The P+ type semiconductor region 4 and the N− type epitaxial semiconductor region 2 thus form a PN junction. The thickness of the N+ type semiconductor region 3 is about 0.5 to 3 µm, the thickness of the P+ type semiconductor region 4 is about 0.2 to 1 µm, and the spacing of the N+ type semiconductor region 3 and the P+ type semiconductor region 4 is about 10-100 µm. A trench 7 is formed by etching and filling between the N+ type semiconductor region 3 and the P+ type semiconductor region 4, and the depth of the trench is about 4 to 20 µm. A single-layer insulating layer, a multi-layer composite insulating layer or light reflecting material 5 is deposited on the surface of the photodiode, the thickness range therof is about 50 to 200 nm so as to isolate external impurities from entering the silicon semiconductor substrate, and may be used as a metal electrode insulator. In addition, according to the characteristics of optics and insulator, it can also be designed as antireflection film. A metal electrode 21 is extracted out of the N+ type semiconductor region 3, and a metal electrode 22 is extracted out of the P+ type semiconductor region 4. A position of the PN junction in a pixel inside the photodiode forms a space charge region 6, when the photodiode is at zero bias or reverse bias. Since the impurity concentration of the P+ type semiconductor region is much larger than that of the N− type epitaxial semiconductor region 2, the space charge region mainly spreads to the N− type epitaxial semiconductor region 2, and the spreading width increases as a reverse bias voltage increases.

Figure 2:
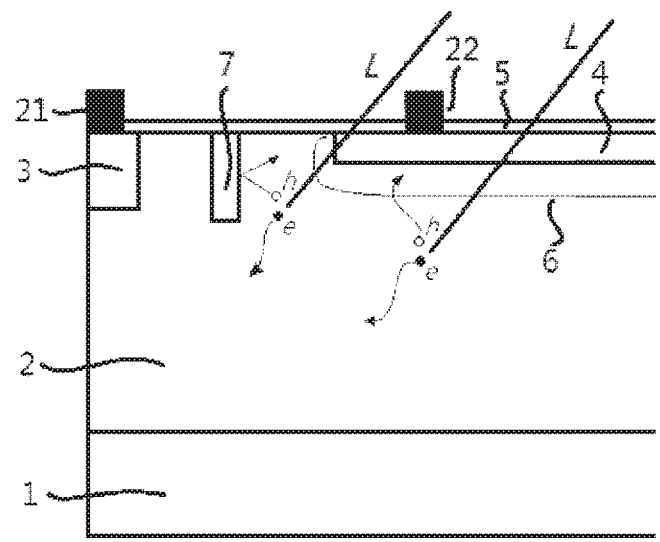
FIG. 2 is a schematic view for explaining a structure of a photodiode according to the first and second embodiments.

FIG. 2 shows a structure of the photodiode according to the first embodiment. A light-collecting active region of a photodiode array is only the space charge region 6 formed just under the P+ type semiconductor region 4. The spacing between the N+ type semiconductor region 3 and the P+ type semiconductor region 4 is a transition region for charge collection, rather than the active region for charge collection. The metal electrode 21 extracted out of the N+ type semiconductor region 3 may block the incident of light and therefore not the active region for charge collection. When light is incident on the P+ type semiconductor region 4, i.e., the light-collecting active region, a large number of electron-hole pairs are excited in the N− type epitaxial semiconductor region 2 and the P+ type semiconductor region 4. Since the light wavelength ranges from 200 nm to 600 nm, the absorption depth in the N− type epitaxial semiconductor region 2 is shallower. The electron carriers drift to the N+ type semiconductor region 3 under a built-in electric field or an externally biased electric field and are finally collected by the metal electrode 21. The hole carriers drift to the P+ type semiconductor region 4 under the built-in electric field and the externally biased electric field and are finally collected by the metal electrode 22 and output as a signal. However, due to the presence of traps in the N− type epitaxial semiconductor region 2, the lifetime of the hole carriers is short, and a part of the hole carriers are trapped by the traps. Hole carriers generated near a center of the active region are more easily collected by the P+ type semiconductor region 4, while hole carriers generated near an edge of the active region and in a non-active region may also be collected by the adjacent pixels or trapped by the traps near the pixels.

In the photodiode array of the first embodiment, a trench structure is formed on a high-resistance semiconductor epitaxial material between the two conductive kinds of heavily doped regions and filled with an insulating material or a plurality of composite insulating material or light reflecting material such as silicon oxide, silicon nitride. When light is incident on the edge of the active region, a part of the excited hole carriers will spread and move to the non-active region, the distance from the P+ type semiconductor region 4 is increased, thereby increasing the probability of being trapped by a silicon body trap. Through physical isolation, it can effectively block the hole carriers from spreading to the non-active region, improve the light response and collection efficiency at the edge of the active region, and then balance the charge collection consistency at different positions in the active region of the pixel.

For example, a trench 7 is formed by etching and filling between the N+ type semiconductor region 3 and the P+ type semiconductor region 4, and is filled with an insulating material such as silicon oxide, silicon nitride, or a plurality of composite insulating materials, or light reflective material. A part of the hole carriers generated by the excitation will spread and move to the non-active region when the light is incident on the edge of the active region or the non-active region. The distance of these hole carriers from the P+ type semiconductor region 4 is increased, and the probability of hole carriers being trapped by silicide traps is increased. Forming of the trench structure between the N+ type semiconductor region 3 and the P+ type semiconductor region 4 may control the range of the hole carrier, effectively prevent the loss of a part of the hole carriers, and increases the probability of the hole carries being collected by the active region. Thus, the light response and collection efficiency at the edge of the active region may be improved, and then the charge collection consistency at different positions in active regions of the pixel may be balanced.

In a photodiode array of the second embodiment, a trench structure is formed on the high-resistance semiconductor epitaxial material between the two conductive types of heavily doped regions and may be filled with a first conductive type heavily-doped monocrystalline semiconductor or polycrystalline semiconductor. Through physical isolation, it is possible to effectively block the hole carriers from spreading to the non-active region. In addition, the first conductive type heavily doped region facilitates spreading of the hole carriers arriving here in an opposite direction (i.e., a direction of the active region), to improve the light response and collection efficiency at the edge of the active region.

As shown in FIG. 2, a trench 7 is formed by etching and filling between the N+ type semiconductor region 3 and the P+ type semiconductor region 4, and the trench 7 may be filled with an N+ type monocrystalline semiconductor or polycrystalline semiconductor. Here, no electrode may be extracted out of the P+ type monocrystalline semiconductor or polycrystalline semiconductor filled in the trench, and this is equivalent to a floating state in the structure. When the hole carriers spread or drift to the edge of the P+ type semiconductor structure, the hole carriers arriving here may spread in the opposite direction (i.e., the direction of the active region) under control of physical isolation and an energy band, to improve the light response and collection efficiency at the edge of the active region.

Figure 3:
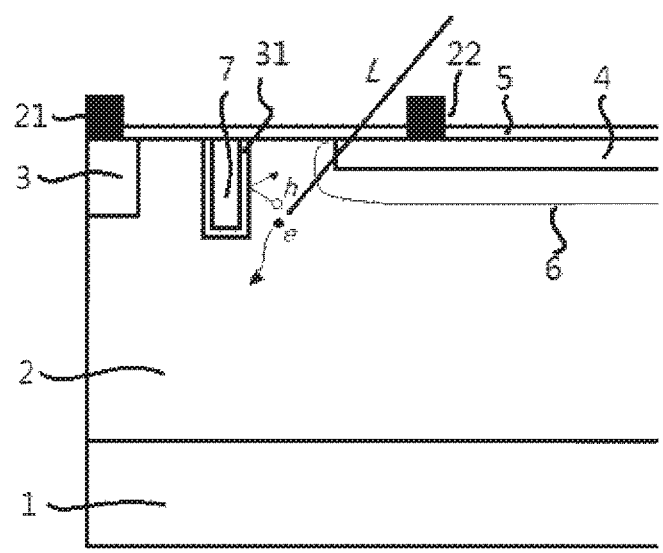
FIG. 3 is a schematic view for explaining a structure of a photodiode according to the third embodiment.

FIG. 3 is a schematic view for explaining a structure of a photodiode according to the third embodiment. In a photodiode array of the third embodiment, a trench structure is formed on the high-resistance semiconductor epitaxial material between the two conductive types of heavily doped regions and may be filled with an insulating material or a plurality of composite insulating material or light reflecting material such as silicon oxide, silicon nitride. Through physical isolation, it is possible to effectively block the hole carriers from spreading to the non-active region. In addition, the first conductive type heavily doped region facilitates spreading of the hole carriers arriving here in an opposite direction (i.e., a direction of the active region), to improve the light response and collection efficiency at the edge of the active region.

As shown in FIG. 3, a trench 7 is formed by etching and filling between the N+ type semiconductor region 3 and the P+ type semiconductor region 4. Then, N+ ion implantation is performed to form an N+ type semiconductor region 31 at the bottom and the sidewall of the trench. The thickness of the N+ type semiconductor region 31 is about 0.1 to 1 µm. Then the trench may be filled with an insulating material or a plurality of composite insulating material or light reflecting material such as silicon oxide, silicon nitride. When the hole carriers spread or drift to the edge of the N+ type semiconductor structure 31, the hole carriers arriving here may spread in the opposite direction (i.e., the direction of the active region) under control of physical isolation and an energy band, to improve the light response and collection efficiency at the edge of the active region.

Figure 4:
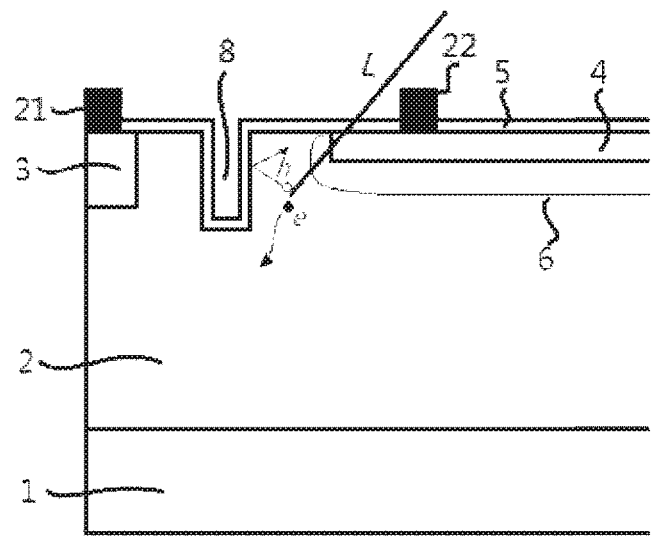
FIG. 4 is a schematic view for explaining a structure of a photodiode according to the fourth embodiment.

FIG. 4 is a schematic view for explaining a structure of a photodiode according to the fourth embodiment. In a photodiode array of the fourth embodiment, a trench structure is formed on the high-resistance semiconductor epitaxial material between the two conductive types of heavily doped regions, and may be constituted with a gap structure. The bottom and the sidewall of the gap structure may be covered with an insulating material or a plurality of composite insulating material or light reflecting material. Through physical isolation, it is possible to effectively block the hole carriers from spreading to the non-active region, thereby improving the light response and collection efficiency at the edge of the active region.

As shown in FIG. 4, a trench 7 is formed by etching and filling between the N+ type semiconductor region 3 and the P+ type semiconductor region 4. Then, an insulating material or a plurality of composite insulating material or light reflecting material 5 such as silicon oxide, silicon nitride is grown at the bottom and the sidewall of the trench. The trench is a gap structure 8. The thickness of an insulating material or a plurality of composite insulating material or light reflecting material 5 such as silicon oxide, silicon nitride is about 0.1 to 1 µm. The trench as the gap structure can well limit the activity range of hole carriers in the epitaxial layer 2 of the semiconductor substrate, effectively prevent the loss of a part of the hole carrier signals and increase the probability of hole carriers being collected by the active region. The light response and collection efficiency of the edge of the active region can be improved, and then the charge collection consistency at different positions of active regions of the pixel can be balanced.

Figure 5:
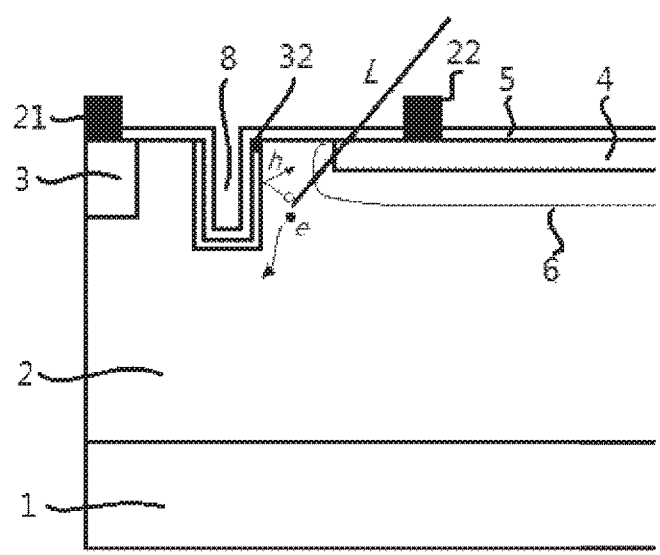
FIG. 5 is a schematic view for explaining a structure of a photodiode according to the fifth embodiment.

FIG. 5 is a schematic view for explaining a structure of a photodiode according to the fifth embodiment. In a photodiode array of the fifth embodiment, a trench structure is formed on the high-resistance semiconductor epitaxial material between the two conductive types of heavily doped regions, and may be constituted with a gap structure. The bottom and the sidewall of the gap structure may be covered with an insulating material or a plurality of composite insulating material or light reflecting material. A heavily doped region of the same doped type as the epitaxial wafer is formed around the trench. Through physical isolation, it is possible to effectively block the hole carriers from spreading to the non-active region. In addition, the second conductive type heavily doped region increases the hole energy band of the trench region and facilitates spreading of hole carriers arriving here in an opposite direction (i.e., the direction of the active region).

As shown in FIG. 5, a trench 7 is formed by etching and filling between the N+ type semiconductor region 3 and the P+ type semiconductor region 4. Then, N+ ion implantation is performed to form an N+ type semiconductor region 32 at the bottom and the sidewall of the trench. The thickness of the N+ type semiconductor region 31 is about 0.1 to 1 µm. An insulating material or a plurality of composite insulating material or light reflecting material 32 such as silicon oxide, silicon nitride is grown at the bottom and the sidewall of the trench. The trench is a gap structure 8. When the hole carriers spread or drift to the edge of the N+ type semiconductor structure 32, the hole carriers arriving here may spread in the opposite direction (i.e., the direction of the active region) under control of physical isolation and an energy band of the trench as the gap structure, to improve the light response and collection efficiency at the edge of the active region.

Figure 6:
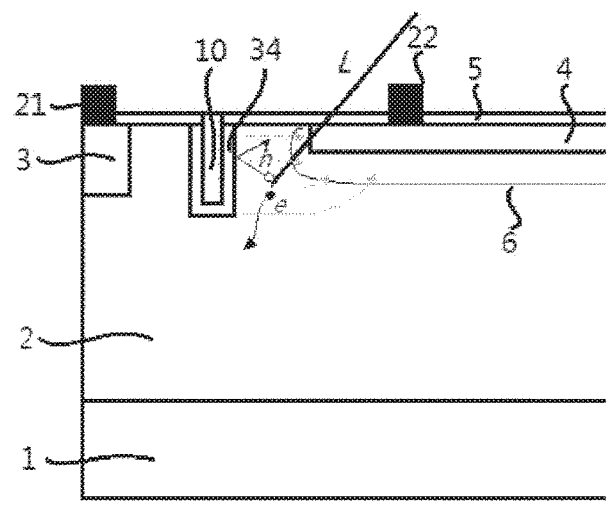
FIG. 6 is a schematic view for explaining a structure of a photodiode according to the sixth embodiment.

FIG. 6 is a schematic view for explaining a structure of a photodiode according to the sixth embodiment. In a photodiode array of the sixth embodiment, a trench structure is formed on the high-resistance semiconductor epitaxial material between the two conductive types of heavily doped regions, may be covered with an insulating material or a plurality of composite insulating material or light reflecting material, and then filled with monocrystalline semiconductor or polycrystalline semiconductor material. Through physical isolation, it is possible to effectively block the hole carriers from spreading to the non-active region. In addition, In addition, the monocrystalline semiconductor material or the polycrystalline semiconductor material can be connected to a zero potential, a floating state, or a high potential relative to the second conductive electrode (extraction electrode of the heavily doped region for light collection). Introducing of an externally applied electric field facilitates spreading of hole carriers arriving here in an opposite direction (i.e., the direction of the active region), to improve the light response and collection efficiency at the edge of the active region.

As shown in FIG. 6, a trench is formed by etching and filling between the N+ type semiconductor region 3 and the P+ type semiconductor region 4. Then an insulating material or a plurality of composite insulating material or light reflecting material 34 such as silicon oxide, silicon nitride is grown at the bottom and the sidewall of the trench. The trench may be filled with the N+ type of P+ type monocrystalline or polycrystalline semiconductor material 10. The N+ type of P+ type monocrystalline or polycrystalline semiconductor 10 is controlled by an externally applied potential, and may be at zero bias, floating state, or forward bias. When the N+ or P+ type monocrystalline or polycrystalline semiconductor material 10 is forward biased, an electric field is generated in the semiconductor in a direction of from the N+ or P+ type monocrystalline or polycrystalline semiconductor 10 to the P+ type semiconductor region 4. Accordingly, when the hole carriers spread or drift to an insulating material or a plurality of composite insulating material or light reflecting material 34 such as silicon oxide, silicon nitride, the hole carriers arriving here may spread in the opposite direction (i.e., the direction of the active region) under control of physical isolation and an energy band of the trench as the gap structure, to improve the light response and collection efficiency at the edge of the active region.

Figure 7:
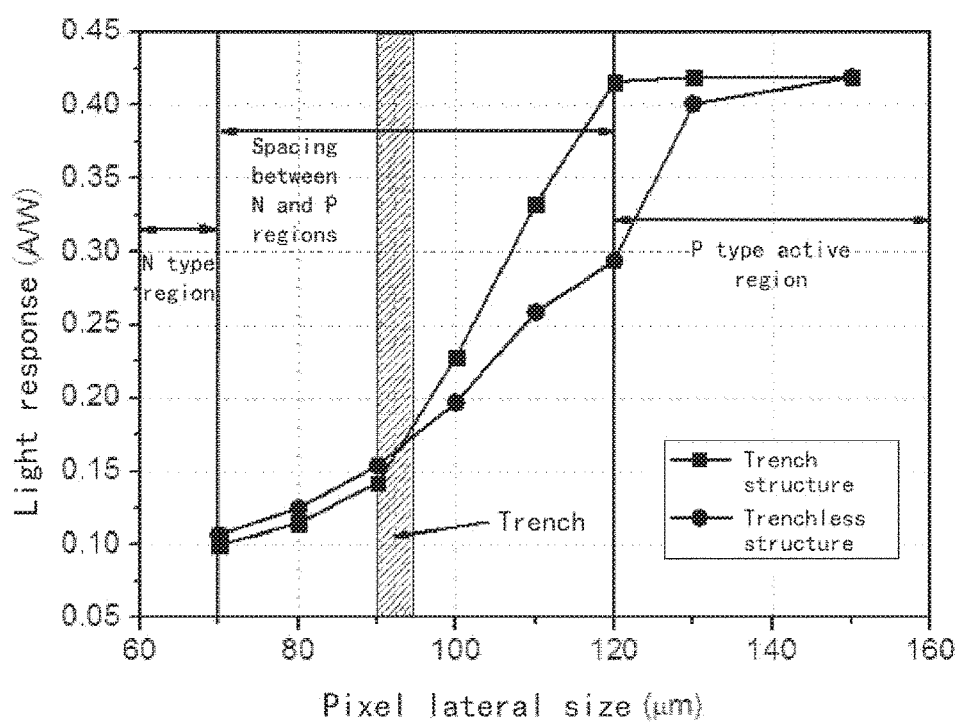
FIG. 7 is a schematic diagram for explaining light response of an edge portion of a light-collecting active region of the photodiode as descripted.
Figure 8:
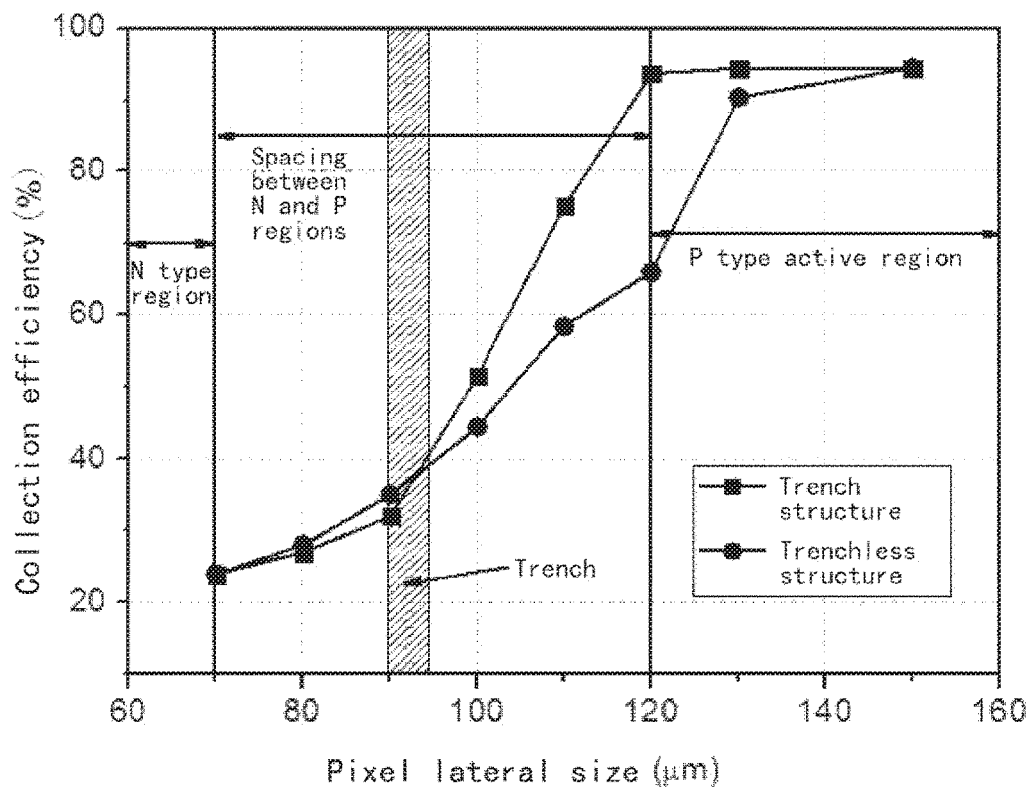
FIG. 8 is a schematic diagram for explaining an collection efficiency of an edge portion of a light-collecting active region of the photodiode as descripted.

FIG. 7 and FIG. 8 show the light response and photoelectric collection efficiency corresponding to different incident positions of the light at the edge of active region of the pixel in a photodiode device with a trench (first embodiment) and without trench. It can be seen from the comparison results that a trench isolation structure can improve a probability of the hole carriers being collected at the edge of the active region of the pixel and improve the light response and collection efficiency at the edge of the active region so as to balance the charge collection consistency at different positions of the pixel.

Figure 9:
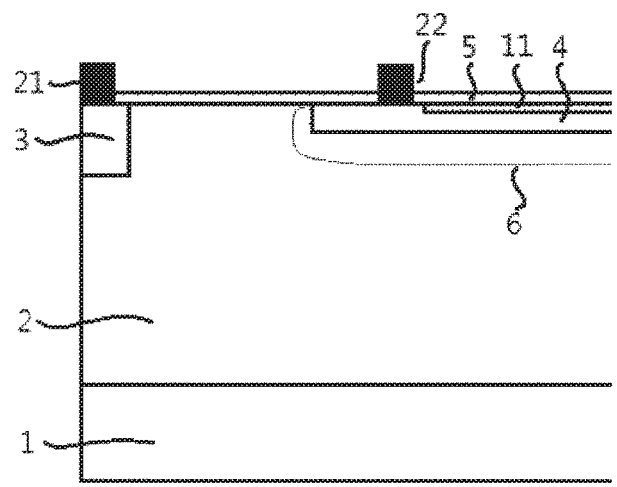
FIG. 9 is a schematic view for explaining a structure of a photodiode according to the seventh embodiment.

FIG. 9 is a schematic view for explaining the structure of a photodiode according to the seventh embodiment. In a photodiode array of the seventh embodiment, a thin first conductive type heavily doped region or a second conductive type lightly doped region is formed on a top layer of the active region for collecting light. As in the process of processing, the device surface is easy to introduce defects or impurities such as ions, and these defects will form a capture center, thereby reducing charge amount collected by the electrode. Generating of a thinner first conductive type heavily doped region in a top layer of the second conductive type heavily doped region may control the upper limit of the boundary of the internal space charge region not to reach the semiconductor surface when the pixel is at zero bias or reverse bias, and reduce the probability of charges being trapped by structural defects. Forming a thinner second conductive type lightly doped region on a top layer of the second conductive type heavily doped region may prevent the hole from spreading or drifting to the device surface, thereby reducing the probability of hole charges being trapped by the structural defects.

As shown in FIG. 9, on the top layer of the P+ type semiconductor region 4, a thinner N+ type semiconductor region 11 is formed by ion implantation, and this region is surrounded by the P+ type semiconductor region 4. In this way, the N+ type semiconductor region 11, the P+ type semiconductor region 4 and the N− type semiconductor substrate epitaxial layer 2 form an N+/P+/N− structure. The upper boundary of the space charge region formed inside the P+ type semiconductor region 4 is limited below the surface of the pixel device, regardless applying the zero bias or the reverse bias to the pixel structure, thereby reducing the probability of holes being trapped by defects of device surface. In addition, a thinner P− type semiconductor region 11 may be formed on the top layer of the P+ type semiconductor region 4 by a manner of controlling ion implantation energy, and this region is surrounded by the P+ type semiconductor region 4. In this way, the P− type semiconductor region 11, the P+ type semiconductor region 4 and the N− type semiconductor substrate epitaxial layer 2 form a P−/P+/N− structure regardless the pixel structure is at zero bias or reverse bias. The build-in electric field may prevent the holes spreading or drifting to the device surface, thereby reducing the probability of the hole charges being trapped by the structural defects.

Figure 10:
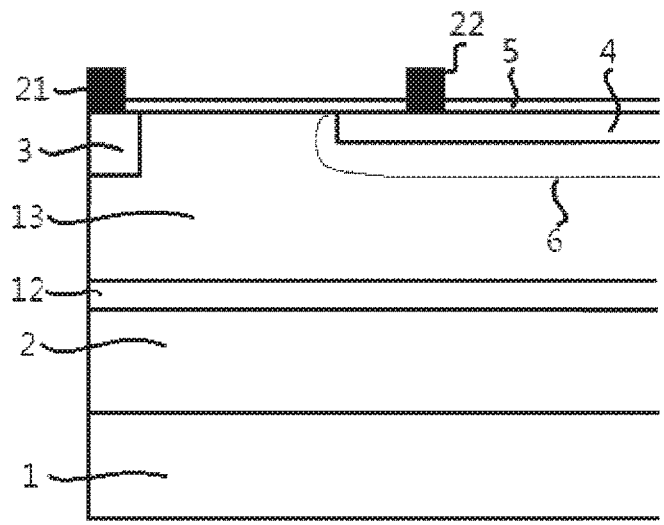
FIG. 10 is a schematic view for explaining a structure of a photodiode according to the eighth embodiment.

FIG. 10 is a schematic view for explaining a structure of a photodiode according to the eighth embodiment. In the photodiode array of the tenth embodiment, a further first conductive type heavily doped region is disposed under the second conductive type heavily doped region and the first conductive type heavily doped region, or only a section of first conductive type heavily doped region is disposed under the second conductive type heavily doped region. The further first conductive type heavily doped region may be a semiconductor such as monocrystalline silicon, polycrystalline silicon or germanium. This structure can thin the charge-sensitive region and reduce trapping of the hole charges by the traps of the first conductive type lightly-doped region underneath. The first conductive type heavily doped regions with the same potential may facilities drifting of the hole charges to the second conductive type heavily doped region, reducing the charge collection time. In addition, the thinned first conductive type lightly doped regions increase the effective resistance between the two electrodes, further reducing the dark current. In addition, the further first conductive type heavily doped region in the pixel may be a trench structure extending to the first conductive type heavily doped region of the same layer to completely isolate the inter-pixel structure and further reduce the inter-pixel charge crosstalk effect. Here, the further first conductive type heavily doped region may be replaced with an insulating material such as silicon dioxide or silicon nitride.

As shown in FIG. 10, a substrate 1 of the semiconductor substrate may be an N+ type region or an N− type region. In this embodiment, an N+ type semiconductor region 12 is disposed at a position of 5 to 20 μm below the N+ type semiconductor region 3 and the P+ type semiconductor region 4 of the pixel, and may be a semiconductor material such as monocrystalline silicon, polycrystalline silicon, or germanium. The potentials of the N+ type semiconductor region 3 and the N+ type semiconductor region 12 in this pixel are equivalent. When the pixel is at zero bias or reverse bias, the electron-hole pairs excited by the photons in the N type semiconductor region 13 respectively drift to the N+ type semiconductor region 3 and the P+ type semiconductor region 4 under the driving of a built-in electric field or an externally applied electric field. The N+ type semiconductor region 12, the N− type semiconductor region 13 and the P+ type semiconductor region 4 form an N+/N−/P+ structure, and the N+ type semiconductor region 12 facilities spreading of the hole carriers to a direction (i.e., the direction of the active region) of the upper P+ type semiconductor region 4, thereby reducing the hole charge collection time. In addition, the N+ type semiconductor region 12 limits the spreading of the charges excited in the N− type semiconductor region 13 into the N− type semiconductor region 2 and reduces the probability of charges being trapped by the traps in the N− type semiconductor region 2. In addition, since the N+ type semiconductor region 12 reduces the effective charge collection region to the N− type semiconductor region 13 and the electrode N+ type semiconductor region 3 and the P+ type semiconductor region 4 have a lateral structure, the effective resistance between the N+ type semiconductor region 3 and the P+ type semiconductor region 4 is increased, thereby reducing the dark current of the pixel. In the embodiment, the N+ type semiconductor region 12 may be an overall continuous structure, or may be disposed only under the P+ type semiconductor region 4, and the specific size of it may be adjusted according to requirements.

In the eighth embodiment, a substrate 1 of the semiconductor substrate may be an N+ type region or an N− type region (that is, regions 1 and 2 being high-resistance semiconductor wafers of the same type region). In this embodiment, an insulating material 12 such as silicon dioxide or silicon nitride is disposed at a position of 5 to 15 μm below the N+ type semiconductor region 3 and the P+ type semiconductor region 4 of the pixel so that the entire semiconductor may be silicon on insulator (SOI) wafer. The insulating material 12 such as silicon dioxide or silicon nitride limits the spreading of the charges excited in the N− type semiconductor region 13 to the N− type semiconductor region 2, and reduces the probability of charges being trapped by the traps in the N− type semiconductor region 2. In addition, since the insulating material 12 such as silicon dioxide or silicon nitride reduces the effective charge collection region to the N− type semiconductor region 13 and the electrode N+− type semiconductor region 3 and the P+− type semiconductor region 4 have a lateral structure, the effective resistance between the N+ type semiconductor region 3 and the P+ type semiconductor region 4 is increased, so that the dark current of the pixel is further reduced. In this embodiment, the insulating material 12 such as silicon oxide or silicon nitride may be an integral continuous structure, or may be disposed only under the P+ type semiconductor region 4, and the specific size of it may be adjusted according to requirements.

Figure 11:
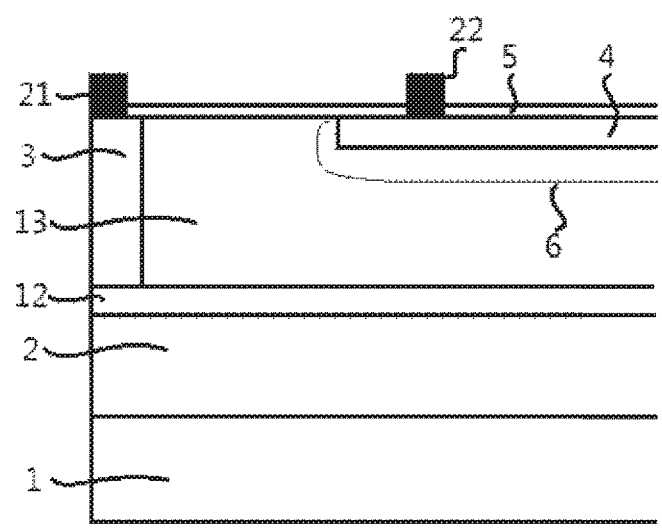
FIG. 11 is a schematic view for explaining a structure of a photodiode according to the ninth embodiment.

FIG. 11 is a schematic view for explaining a structure of a photodiode according to the ninth embodiment. In a photodiode array of the tenth embodiment, a conductive structure with an insulating layer is disposed under the second conductive type heavily doped region and the first conductive type heavily doped region, or only a section of a conductive structure with insulation layer is disposed under the second conductive type heavily doped region. The conductive structure with the insulating layer may be made of an insulating material such as silicon dioxide or silicon nitride, a semiconductor material such as heavily doped monocrystalline silicon, polycrystalline silicon, or germanium, and an insulating material such as silicon dioxide or silicon nitride. The conductive structure with insulating layer potential can be controlled independently. The conductive structure with the insulating layer can thin the charge-sensitive region and reduce trapping of the hole charges by the traps of the first conductive type lightly-doped region underneath. The first conductive type heavily doped regions and the conductive structures with the same potential facilities drifting of the hole charges to the second conductive type heavily doped regions, reducing the charge collection time. In addition, the thinned first conductive type lightly doped regions increase the effective resistance between the two electrodes, thereby reducing the dark current. In addition, the first conductive type heavily doped region in the pixel may be a trench structure extending to a semiconductor material such as heavily doped monocrystalline silicon, polycrystalline silicon, or germanium in the conductive structure with the insulating layer, completely isolate the inter-pixel structure and reduce the inter-pixel charge crosstalk effect.

As shown in FIG. 11, a substrate 1 of the semiconductor substrate may be an N+ type region. In this embodiment, an N+ type semiconductor region 12 is disposed at a position of 5 to 15 μm below the N+ type semiconductor region 3 and the P+ type semiconductor region 4 of the pixel, and may be a semiconductor material such as monocrystalline silicon, polycrystalline silicon, or germanium. And the N+ type semiconductor region 3 is a trench structure extending to the N+ type semiconductor region 12, so that the potential distributions of the N+ type semiconductor region 3 and the N+ type semiconductor region 12 in the pixel are the same. When the pixel is at zero bias or reverse bias, the electron-hole pairs excited by the photons in the N− type semiconductor region 13 respectively drift to the N+ type semiconductor region 3 and the P+ type semiconductor region 4 under the driving of a built-in electric field or an externally applied electric field. In addition, the N+ type semiconductor region 12, the N− type semiconductor region 13 and the P+ type semiconductor region 4 form an N+/N−/P+ structure, and the N+ type semiconductor region 12 facilities spreading of the hole carriers in a direction (i.e., the direction of the active region) of the upper P+ type semiconductor region 4, thereby reducing the hole charge collection time. And N+ type semiconductor region 3 with the trench structure and the insulating material 12 such as silicon dioxide or silicon nitride completely isolate the pixel from the pixel structure and further suppress the inter-pixel crosstalk effect. In addition, the N+ type semiconductor region 12 limits the spreading of the charges excited in the N− type semiconductor region 13 to the N− type semiconductor region 2 and reduces the probability of charges being trapped by the traps in the N− type semiconductor region 2. In addition, since the N+ type semiconductor region 12 reduces the effective charge collection region to the N− type semiconductor region 13 and the electrode N+ type semiconductor region 3 and the P+ type semiconductor region 4 have a lateral structure, the effective resistance between the N+ type semiconductor region 3 and the P+ type semiconductor region 4 is increased, thereby reducing the dark current of the pixel. In the embodiment, the N+ type semiconductor region 12 may be an overall continuous structure, or may be disposed only under the P+ type semiconductor region 4, and the specific size of it may be adjusted according to requirements In the ninth embodiment, a substrate 1 of a semiconductor substrate may be an N+ type region or an N− type region (that is, regions 1 and 2 are a high-resistance semiconductor wafer of the same type region). In this embodiment, an insulating material 12 such as silicon dioxide or silicon nitride is disposed at a position of 5 to 15 µm below the N+ type semiconductor region 3 and the P+ type semiconductor region 4 of the pixel so that the entire semiconductor may be silicon on insulator (SOI) wafer. And the N+ type semiconductor region 3 is a trench structure extending to the insulating material 12 such as silicon dioxide or silicon nitride. The N+ type semiconductor region 3 having the trench structure and an insulating material 12 such as silicon dioxide or silicon nitride isolate the pixel from the pixel structure completely, thereby suppressing the inter-pixel charge crosstalk effect. The insulating material 12 such as silicon dioxide or silicon nitride limits the spreading of the charges excited in the N− type semiconductor region 13 to the N− type semiconductor region 2 and reduces the probability of charges being trapped by the traps in the N− type semiconductor region 2. In addition, since the insulating material 12 such as silicon dioxide or silicon nitride reduces the effective charge collection region to the N− type semiconductor region 13 and the electrode N+ type semiconductor region 3 and the P+ type semiconductor region 4 have a lateral structure, the effective resistance between the N+ type semiconductor region 3 and the P+ type semiconductor region 4 is increased, so that the dark current of the pixel is further reduced. In this embodiment, the insulating material 12 such as silicon oxide or silicon nitride may be an integral continuous structure, or may be disposed only under the P+ type semiconductor region 4, and the specific size of it may be adjusted according to requirements.

Figure 12:
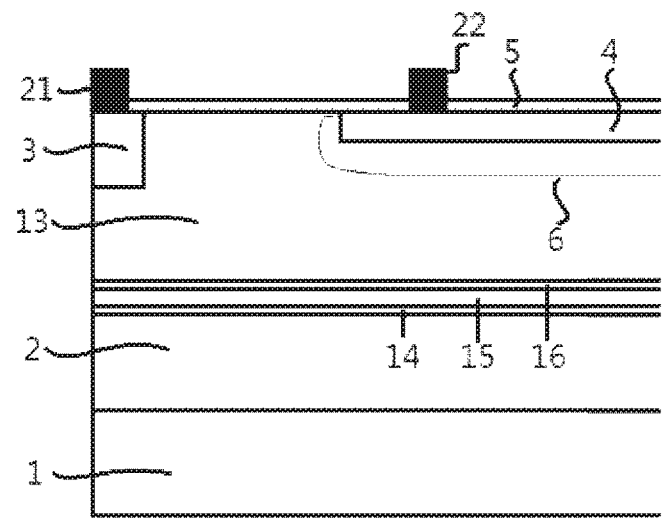
FIG. 12 is a schematic view for explaining a structure of a photodiode according to the tenth embodiment.

FIG. 12 shows a tenth embodiment. In the tenth embodiment, a substrate 1 of a semiconductor substrate may be an N+ type region or may be an N− type region. In this embodiment, a conductive structure with an insulating layer, which is respectively an insulating layer 14 such as silicon dioxide or silicon nitride, a heavily doped semiconductor material 15 such as monocrystalline silicon, polycrystalline silicon, or germanium, and an insulating layer 16 such as silicon dioxide or a silicon nitride, is disposed at a position of 5 to 15 µm below the N+ type semiconductor region 3 and the P+ type semiconductor region 4 of the pixel. This overall is a double-layer silicon on insulator (DSOI) wafer structure. The heavily doped semiconductor material 15 such as monocrystalline silicon, polycrystalline silicon, or germanium can be independently controlled in potential to modulate an electric field distribution inside the N− type semiconductor region 13. When the pixel is at zero bias or reverse bias, the electron-hole pairs excited by the photons in the N− type semiconductor region 13 respectively spread to the N+ type semiconductor region 3 and the P+ type semiconductor region 4 under the driving of a built-in electric field or an externally applied electric field drift. The heavily doped semiconductor material 15 such as monocrystalline silicon, polycrystalline silicon, or germanium facilities the hole carriers spreading in the direction of the upper P+ type semiconductor region 4 (i.e., in the direction of the active region), thereby reducing the hole charge collection time. In addition, the conductive structure with an insulating layer limits the spreading of the charges excited in the N− type semiconductor region 13 to the N− type semiconductor region 2 and reduces the probability of charges being trapped by the traps in the N− type semiconductor region 2. In addition, since the conductive structure with the insulating layer reduces the effective charge collection region to the N− type semiconductor region 13, and the electrode N+ type semiconductor region 3 and the P+ type semiconductor region 4 have a lateral structure, the effective resistance between the N+ type semiconductor region 3 and the P+ type semiconductor region 4 is increased, thereby reducing the dark current of the pixel. The conductive structure with insulating layers 14, 15 and 16 in this embodiment may be of an integral continuous structure, or may be disposed only under the P+ type semiconductor region 4, and the specific size of it may be adjusted according to requirements.

Figure 13:
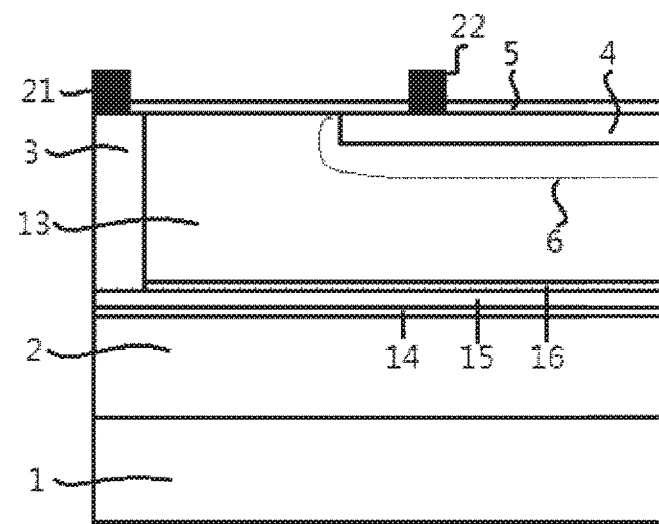
FIG. 13 is a schematic view for explaining a structure of a photodiode according to the eleventh embodiment.

FIG. 13 shows the eleventh embodiment. In the eleventh embodiment, a substrate 1 of a semiconductor substrate may be an N+ type region or an N− type region. In this embodiment, a conductive structure with an insulating layer, which is respectively an insulating layer 14 such as silicon dioxide or a silicon nitride, a heavily doped semiconductor material 15 such as monocrystalline silicon, polycrystalline silicon, or germanium, an insulating layer 16 such as silicon dioxide or a silicon nitride, is disposed at a position of 5 to 15 µm below the N+ type semiconductor region 3 and the P+ type semiconductor region 4 of the pixel. This overall is a double-layer silicon on insulator (DSOI) wafer structure. The N+ type semiconductor region 3 is a trench structure extending to the heavily-doped semiconductor material 15 such as monocrystalline silicon, polycrystalline silicon or germanium, the N+ type semiconductor region 3 as the trench structure and the conductive structure with the insulating layer isolate the pixel from the pixel structure completely, thereby suppressing the inter-pixel charge crosstalk effect. The heavily doped semiconductor material 15 such as monocrystalline silicon, polycrystalline silicon, or germanium has the same potential as the N+ type semiconductor region 3, so that the electric field distribution in the N− type semiconductor region 13 can be modulated by controlling the potential of the N+ type semiconductor region 3. When the pixel is at zero bias or reverse bias, the electron-hole pairs excited by the photons in the N− type semiconductor region 13 respectively drift to the N+ type semiconductor region 3 and the P+ type semiconductor region 4 under the driving of a built-in electric field or an externally applied electric field. The heavily doped semiconductor material 15 such as monocrystalline silicon, polycrystalline silicon, or germanium facilities the hole carriers spreading in the direction of the upper P+ type semiconductor region 4 (i.e., in the direction of the active region), thereby reducing the hole charge collection time. In addition, the conductive structure with the insulating layer limits the spreading of the charges excited in the N− type semiconductor region 13 to the N− type semiconductor region 2 and reduces the probability of charge being trapped by the traps in the N− type semiconductor region 2. In addition, since the conductive structure with the insulating layer reduces the effective charge collection region to the N− type semiconductor region 13, and the electrode N+ type semiconductor region 3 and the P+ type semiconductor region 4 have a lateral structure, the effective resistance between the N+ type semiconductor region 3 and the P+ type semiconductor region 4 is increased, thereby reducing the dark current of the pixel. The conductive structure with insulating layers 14, 15 and 16 in this embodiment may be of an integral continuous structure, or may be disposed only under the P+ type semiconductor region 4, and the specific size of it may be adjusted according to requirements.

The photodiode array of the above embodiments of the present disclosure is mainly applied to a 200 to 600 nm wavelength X-ray detector (emits light with a wavelength of about 550 nm through a scintillator such as CsI) and is mainly absorbed within 5 micrometers of depth of the surface of the silicon epitaxial wafer. Therefore, the trench isolation structure, the first conductive heavily doped layer, the depth of the insulating material layer, and the conductive structure with the insulating layer can be controlled to be between 5 and 20 μm. In this case, as described above, the action effect of the trench structure can be ensured.

In addition, the photodiode array according to the embodiments of the present disclosure operates in the wavelength range of 200 to 600 nm, the light absorption in the active area of the pixel has better consistency, reduces the dark current of the pixel, and accelerates the pixel charge collection rate.

Although exemplary embodiments of the present disclosure have been described for illustrative purposes, it should be understood by those skilled in the art that various modifications, combinations, additions and substitutions are possible, without departing from scope and spirit of the disclosure disclosed in the claims.

We claim:

1. A coplanar electrode photodiode array comprising a plurality of coplanar photodiodes, each coplanar photodiode comprising: a first conductive type heavily doped semiconductor substrate; a first conductive type lightly doped semiconductor layer formed on the first conductive type heavily doped semiconductor substrate; a second conductive type heavily doped semiconductor region formed on an upper portion of the first conductive type lightly doped semiconductor layer, wherein the second conductive type heavily doped semiconductor region and the first conductive type lightly doped semiconductor layer form a PN junction diode, and a second electrode is extracted out of the second conductive type heavily doped semiconductor region at a light incidence side; a first conductive type heavily doped semiconductor region surrounding the second conductive type heavily doped semiconductor region, wherein a first electrode is extracted out of the first conductive type heavily doped semiconductor region at the light incidence side; and a trench structure disposed between the second conductive type heavily doped semiconductor region and the first conductive type heavily doped semiconductor region, the trench structure including a trench, with an insulating material or a plurality of composite insulating materials or light reflecting materials covering a bottom and a sidewall of the trench, and the trench being filled with a heavily doped monocrystalline semiconductor material of the first conductive type or a heavily doped polycrystalline semiconductor material of the first conductive type formed on the insulating material or the plurality of composite insulating materials or the light reflecting materials.

2. The coplanar electrode photodiode array according to claim 1, wherein the heavily doped monocrystalline semiconductor material of the first conductive type or the heavily doped polycrystalline semiconductor material of the first conductive type is around the trench.

3. The coplanar electrode photodiode array according to claim 1, wherein the trench is not completely filled.

4. The coplanar electrode photodiode array according to claim 1, wherein the heavily doped monocrystalline semiconductor material of the first conductive type or the heavily doped polycrystalline semiconductor material of the first conductive type filled in the trench is connected to a high potential relative to the second electrode at.

5. The coplanar electrode photodiode array according to claim 1, wherein a thin first conductive type heavily doped region or a second conductive type lightly doped region is formed in an upper portion of the second conductive type heavily doped semiconductor region and surrounded by the second conductive type heavily doped semiconductor region.

6. The coplanar electrode photodiode array according to claim 1, wherein a continuous first conductive type heavily doped region is formed in a lower portion of the second conductive type heavily doped semiconductor region or only a section of the first conductive type heavily doped region is disposed under the second conductive type heavily doped semiconductor region.

7. The coplanar electrode photodiode array according to claim 1, wherein a continuous insulating material region is formed under the second conductive type heavily doped semiconductor region, or only a section of the insulating material region is disposed under the second conductive type heavily doped semiconductor region.

8. The coplanar electrode photodiode array according to claim 6, wherein the first conductive type heavily doped semiconductor region is formed as a second trench structure, which extends down to and is connected to the first conductive type heavily doped region.

9. The coplanar electrode photodiode array according to claim 1, wherein a continuous composite structure is formed under the second conductivity type heavily doped semiconductor region or only a section of the composite structure is disposed under the second conductive type heavily doped semiconductor region, and the composite structure is made of an insulating material and a semiconductor material.

10. The coplanar electrode photodiode array according to claim 9, wherein the first conductive type heavily doped semiconductor region is a second trench structure, which extends down to and is connected to the semiconductor material of the composite structure.

11. A method for manufacturing a coplanar electrode photodiode, comprising: forming a first conductivity type lightly doped semiconductor layer on a first conductive type heavily doped semiconductor substrate; forming a second conductive type heavily doped semiconductor region on an upper portion of the first conductive type lightly doped semiconductor layer, wherein the second conductive type heavily doped semiconductor region and the first conductive type lightly doped semiconductor layer form a PN junction diode, and a second electrode is extracted out of the second conductive type heavily doped semiconductor region at a light incidence side; forming a first conductive type heavily doped semiconductor region around the second conductive type heavily doped semiconductor region, wherein a first electrode is extracted out of the first conductive type heavily doped semiconductor region at the light incidence side; and disposing a trench structure between the second conductive type heavily doped semiconductor region and the first conductive type heavily doped semiconductor region, the trench structure including a trench, with an insulating material or a plurality of composite insulating materials or light reflecting materials covering a bottom and a sidewall of the trench, and the trench being filled with a heavily doped monocrystalline semiconductor material of the first conductive type or a heavily doped polycrystalline semiconductor material of the first conductive type formed on the insulating material or the plurality of composite insulating materials or the light reflecting materials.

12. The coplanar electrode photodiode array according to claim 7, wherein the first conductive type heavily doped semiconductor region is formed as a second trench structure, which extends down to and is connected to the insulating material region.

* * * * *